US006222379B1

(12) United States Patent
Farnworth et al.

(10) Patent No.: US 6,222,379 B1
(45) Date of Patent: Apr. 24, 2001

(54) CONVENTIONALLY SIZED TEMPORARY PACKAGE FOR TESTING SEMICONDUCTOR DICE

(75) Inventors: Warren M. Farnworth, Nampa; Alan G. Wood, Boise; David R. Hembree, Boise; Salman Akram, Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/093,357

(22) Filed: Jun. 8, 1998

Related U.S. Application Data

(60) Division of application No. 08/580,687, filed on Dec. 29, 1995, now Pat. No. 5,815,000, which is a continuation-in-part of application No. 08/398,309, filed on Mar. 1, 1995, now Pat. No. 5,519,332, which is a continuation-in-part of application No. 08/345,064, filed on Nov. 14, 1994, now Pat. No. 5,541,525, which is a continuation-in-part of application No. 08/124,899, filed on Sep. 21, 1993, now Pat. No. 5,495,179, which is a continuation-in-part of application No. 08/046,675, filed on Apr. 14, 1993, now Pat. No. 5,367,253, which is a continuation-in-part of application No. 07/973,931, filed on Nov. 10, 1992, now Pat. No. 5,302,891, which is a continuation of application No. 07/709,858, filed on Jun. 4, 1991, now abandoned.

(51) Int. Cl.[7] .................................................. G01R 31/02
(52) U.S. Cl. ...................................... 324/755; 324/765
(58) Field of Search .................................. 324/765, 755, 324/754, 757

(56) References Cited

U.S. PATENT DOCUMENTS

| | | | |
|---|---|---|---|
| D. 394,844 | 6/1998 | Farnworth et al. | D13/182 |
| D. 401,567 | 11/1998 | Farnworth et al. | |
| D. 402,638 | 12/1998 | Farnworth et al. | |
| 4,169,642 | 10/1979 | Mouissie | 339/17 F |
| 4,597,617 | 7/1986 | Enochs | 339/17 CF |
| 4,783,719 | 11/1988 | Jamison et al. | 361/398 |
| 4,969,828 | 11/1990 | Bright et al. | 439/68 |
| 5,006,792 | 4/1991 | Malhi et al. | 324/158 F |
| 5,073,117 | 12/1991 | Malhi et al. | 439/71 |
| 5,088,190 | 2/1992 | Malhi et al. | 29/843 |
| 5,123,850 | 6/1992 | Elder et al. | 439/67 |
| 5,302,891 | 4/1994 | Wood et al. | 324/158 F |
| 5,367,253 | 11/1994 | Wood et al. | 324/158.1 |
| 5,408,190 | 4/1995 | Wood et al. | 324/765 |
| 5,440,240 | 8/1995 | Wood et al. | 324/765 |
| 5,451,165 | 9/1995 | Cearley-Cabbiness et al. | 439/71 |
| 5,483,741 | 1/1996 | Akram et al. | 29/846 |
| 5,495,179 | 2/1996 | Wood et al. | 324/755 |
| 5,519,332 | 5/1996 | Wood et al. | 324/755 |
| 5,530,376 | 6/1996 | Lim et al. | 324/765 |
| 5,541,525 | 7/1996 | Wood et al. | 324/755 |
| 5,543,725 | 8/1996 | Lim et al. | 324/755 |
| 5,572,140 | 11/1996 | Lim et al. | 324/755 |
| 5,578,934 | 11/1996 | Wood et al. | 324/758 |
| 5,581,195 | 12/1996 | Lee et al. | 324/755 |
| 5,739,050 | 4/1998 | Farnworth | 438/15 |
| 5,742,169 | 4/1998 | Akram et al. | 324/755 |

(List continued on next page.)

Primary Examiner—Ernest Karlsen
(74) Attorney, Agent, or Firm—Stephen A. Gratton

(57) ABSTRACT

A method for packaging and testing a semiconductor die is provided. The method includes forming a temporary package for the die that has a size, shape and lead configuration that is the same as a conventional plastic or ceramic semiconductor package. The temporary package can be used for burn-in testing of the die using standard equipment. The die can then be removed from the package and certified as a known good die. In an illustrative embodiment the package is formed in a SOJ configuration. The package includes a base, an interconnect and a force applying mechanism. The package base can be formed of ceramic or plastic using a ceramic lamination process or a Cerdip formation process.

11 Claims, 8 Drawing Sheets

U.S. PATENT DOCUMENTS

| | | |
|---|---|---|
| 5,783,461 | 7/1998 | Hembree . |
| 5,815,000 | 9/1998 | Farnworth et al. . |
| 5,825,195 | 10/1998 | Hembree et al. . |
| 5,834,945 | 11/1998 | Akram et al. . |
| 5,878,485 | 3/1999 | Wood et al. . |
| 5,896,036 | 4/1999 | Wood et al. . |
| 5,929,647 | 7/1999 | Akram et al. . |
| 5,949,242 | 9/1999 | Wood et al. .......................... 324/760 |
| 5,982,185 | 11/1999 | Farnworth . |
| 6,060,893 | 5/2000 | Farnworth et al. ................... 324/755 |
| 6,072,323 | 6/2000 | Hembree et al. .................... 324/755 |
| 6,091,251 | 7/2000 | Wood et al. .......................... 324/755 |
| 6,094,058 | 7/2000 | Hembree et al. .................... 324/755 |

CONVENTIONALLY SIZED TEMPORARY PACKAGE FOR TESTING SEMICONDUCTOR DICE

CROSS REFERENCE TO RELATED APPLICATIONS

This application is a division of U.S. patent application Ser. No. 08/580,687 filed on Dec. 29, 1995, U.S. Pat. No. 5,815,000, which is a continuation-in-part of application Ser. No. 08/398,309 filed on Mar. 1, 1995, U.S. Pat. No. 5,519,332, which is a continuation-in-part of application Ser. No. 08/345,064 filed on Nov. 14, 1994, U.S. Pat. No. 5,541,525, which is a continuation-in-part of application Ser. No. 08/124,899 filed on Sep. 21, 1993, U.S. Pat. No. 5,495,179, which is a continuation-in-part of application Ser. No. 08/046,675, filed on Apr. 14, 1993, U.S. Pat. No. 5,367,253, which is a continuation-in-part of application Ser. No. 07/973,931 filed on Nov. 10, 1992, U.S. Pat. No. 5,302,891, which is a continuation of application Ser. No. 07/709,858, filed on Jun. 4, 1991, abandoned.

This application is related to applications Ser. No. 07/788,065 filed Nov. 5, 1991 U.S. Pat. No. 5,440,240; 07/953,750 filed Sep. 29, 1992; 08/073,005 filed Jun. 7, 1993; 08/073,003 filed Jun. 7, 1993; 08/120,628 filed Sep. 13, 1993; 07/896,297 filed Jun. 10, 1992; 08/192,391 filed Feb. 3, 1994; and, 08/137,675 filed Oct. 14, 1993.

FIELD OF THE INVENTION

This invention relates generally to semiconductor manufacture and more particularly to an improved method and apparatus for packaging and testing semiconductor dice.

BACKGROUND OF THE INVENTION

Conventionally packaged semiconductor dice are tested several times during the manufacturing process. A probe test is conducted at the wafer level to test the gross functionality of the dice. Following singulation of the wafer and packaging of the individual dice, full functionality and burn-in tests are performed on each of the packaged die. These tests are typically performed using standardized equipment that provides an electrical interface between the external contacts on the package (e.g., terminal leads) and test circuitry.

For example, burn-in ovens are adapted to hold a large number of packaged dice in a chamber with temperature cycling capability. During the burn-in test the integrated circuits are electrically tested at different temperatures. A burn-in board mountable within the chamber, includes electrical connectors that mate with the external leads on the packaged dice to establish an electrical interconnection between the individually packaged dice and test circuitry. For packaged dice having a male external contact, such as terminal leads formed as pins, the burn-in board may include socket connectors. For packaged dice having female external contacts, such as flat pads in a land grid array, the burn-in board may include pogo pin connectors.

Because semiconductor dice are packaged in standardized configurations, the burn-in boards are also standardized. For example, one common semiconductor package for a single die is known as a small outline j-lead package (SOJ). A burn-in board for SOJ packages will include standardized sockets that mate with the j-leads for the packages. In addition, the spacing for the sockets will be such that a large number of packages can be mounted on a single board in a dense closely spaced array.

In addition to the boards being standardized, there is also associated equipment, such as automated handling apparatus, that is standardized for a particular package configuration. Other standardized packages for a single die include the dual in-line (DIP) package and the zigzag in-line package (ZIP).

Recently, semiconductor dice have been supplied by manufacturers in an unpackaged or bare configuration. A known good die (KGD) is an unpackaged die that has been tested to a quality and reliability level equal to the packaged product. To certify a die as a known good die the unpackaged die must be burn-in tested. This has led to the development of test carriers that hold a single unpackaged die for burn-in and other tests. Each test carrier houses a die for testing and also provides the electrical interconnection between the die and external test circuitry. Exemplary test carriers are disclosed in U.S. Pat. No. 5,302,891 to Wood et al. and U.S. Pat. No. 5,408,190 to Wood et al.

One aspect of these carriers is that they require specialized test equipment such as specialized burn-in boards and handling equipment that are different than the equipment used for testing packaged dice. In addition, the prior art carriers are larger than conventionally packaged dice and therefore require more and larger test equipment to achieve the same throughputs. It would be advantageous to provide a method for packaging and testing semiconductor dice that can be used with standardized test equipment.

In view of the foregoing, it is an object of the present invention to provide an improved method for packaging and testing semiconductor dice. It is another object of the present invention to provide a temporary package for a bare semiconductor die in which a temporary electrical connection can be made to the die for testing or other purposes. It is yet another object of the present invention to provide an improved method for testing semiconductor dice that uses a small outline temporary package and standard test equipment. It is a further object of the present invention to provide a temporary semiconductor package that has a JEDEC standard outline and JEDEC standard external contact configuration. Other objects advantages and capabilities of the present invention will become more apparent as the description proceeds.

SUMMARY OF THE INVENTION

In accordance with the present invention, an improved method for packaging and testing a semiconductor die is provided. The method, broadly stated, comprises forming a temporary package for a bare semiconductor die having a standard outline and external lead configuration that matches a conventional semiconductor package, and then testing the die using the temporary package and standardized testing apparatus. The standard outline and external lead configuration of the temporary package permits standardized burn-in boards and automated package handling equipment to be used during a test procedure for known good die. In an illustrative embodiment, the temporary package is formed in the configuration of a small outline j-bend (SOJ) plastic package.

The temporary package includes a base, an interconnect and a force applying mechanism. The package base can be either plastic or ceramic. In an illustrative embodiment, the package base is formed using a ceramic lamination process. The package base can also be formed of plastic using a 3-D injection molding process or either ceramic or plastic using a ceramic dip formation (Cerdip) process. The package base includes metallic conductors in electrical communication with external contacts formed as j-bend leads.

The interconnect for the package is mounted to the base and wire bonded to the conductors formed on the package base. In the illustrative embodiment, the interconnect is formed of silicon and includes conductive lines and raised contact members that contact and establish electrical communication with the bond pads on the die. The interconnect can also be formed with microbump contact members mounted on a plastic film similar to two layer TAB tape.

The force applying mechanism for the package includes a pressure plate, a spring and a cover. The force applying mechanism functions to secure the die within the base and to maintain the die and interconnect in electrical contact. The force applying mechanism is secured to the base with a latching mechanism. Several different embodiments for the latching mechanism are disclosed including a sliding latch and a T-shaped latch. In some embodiments the pressure plate and spring are replaced by an elastomeric member.

The package is assembled by optically aligning the die and the interconnect. Prior to the alignment procedure the interconnect is mounted within the package base by wire bonding. During the alignment procedure, the die and force applying mechanism of the package are held by an assembly tool. Flip chip optical alignment is used to align the bond pads on the die to the contact members on the interconnect. The assembly tool then places the die on the interconnect and attaches the force applying mechanism to the package base.

In an alternate embodiment of the package, the die is mounted circuit side up within the package. This arranges the bond pads for the die and the external leads for the package in a configuration that is identical to a conventional packaged die.

DETAILED DESCRIPTION OF THE PREFERRED EMBODIMENTS

Figure 1:
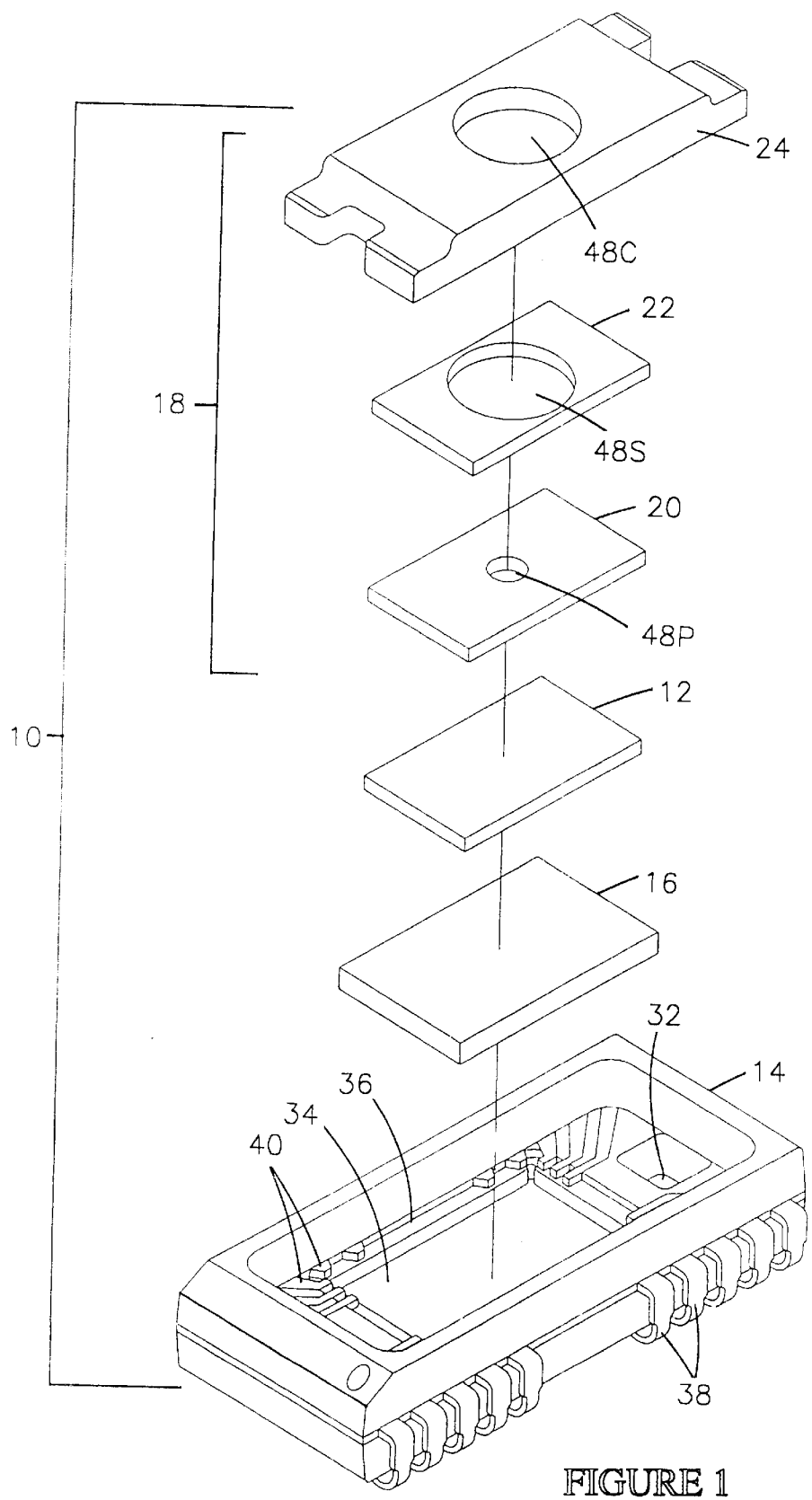
FIG. 1 is an exploded perspective view of a package constructed in accordance with the invention.

Referring to FIG. 1, an exploded perspective view of a temporary package 10 constructed in accordance with the invention is shown. The package 10 is adapted to hold a semiconductor die 12 and to establish a temporary electrical connection with the die 12 for testing and burn-in. Following the test procedure the die 12 can be removed from the package 10 and used as a known good die.

The package 10, generally stated, includes a package base 14, an interconnect 16, and a force applying mechanism 18. The interconnect 16 establishes electrical communication between the package base 14 and the die 12. The force applying mechanism 18 secures the die 12 to the package base 14 and presses the die 12 against the interconnect 16. The force applying mechanism 18 includes a pressure plate 20, a spring 22 and a cover 24. The package 10 also includes a latching mechanism in the form of clips 26, 28 (FIG. 3) which secure the force applying mechanism 18 to the package base 14.

Figure 2:
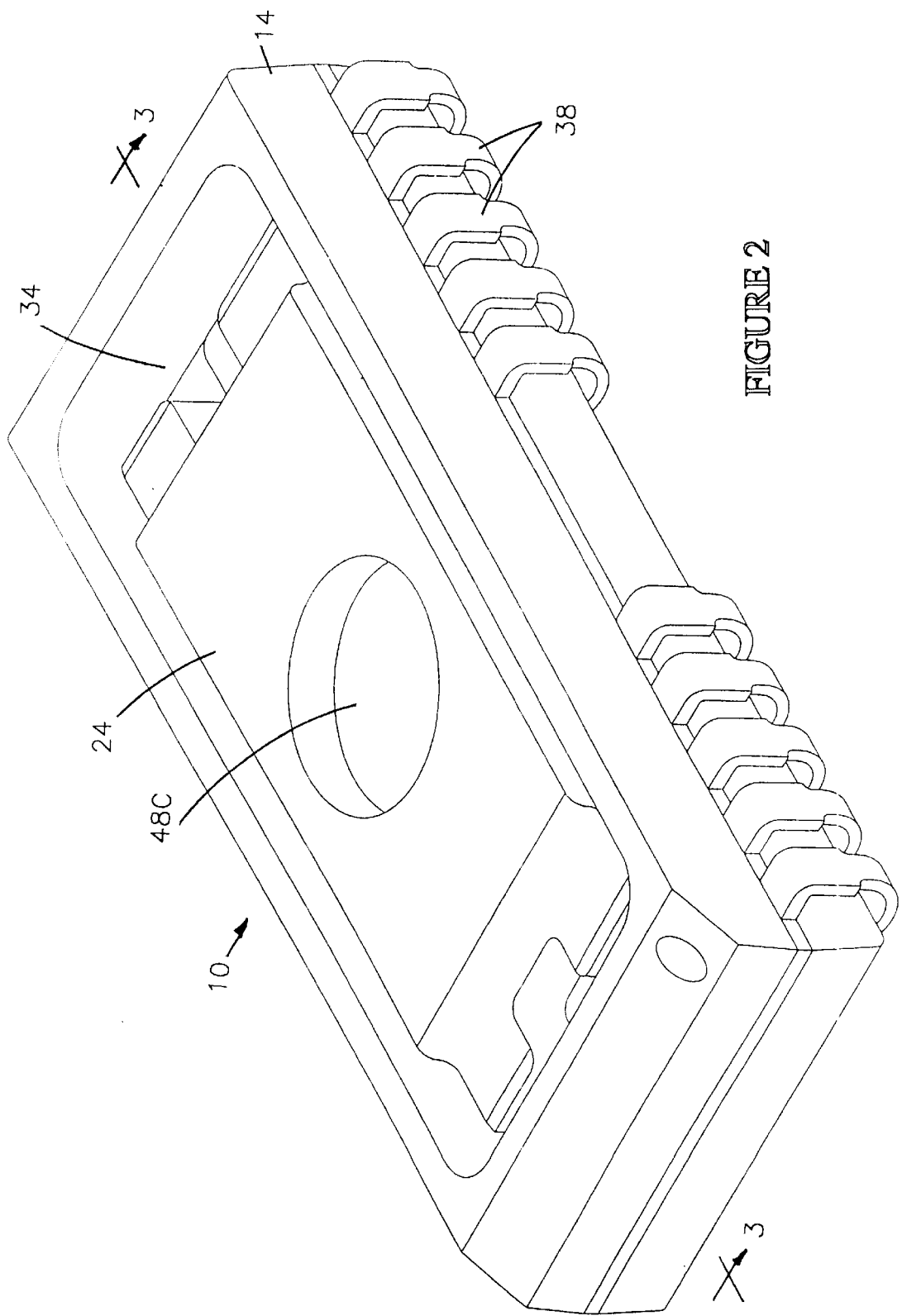
FIG. 2 is a perspective view of the package.

FIG. 2 illustrates the assembled package 10. As shown in FIG. 2, the package 10 has a size and rectangular shape that is substantially equivalent in size and shape to a conventional semiconductor package. As used herein, the term conventional semiconductor package refers to a plastic or ceramic package having a size and external lead configuration that conforms to standards of a recognized industry standard setting body. These standard setting bodies can include:

EIA/JEDEC—Electronics Industry Association—Joint Electron Device Engineering Council JEIDA—Japanese Electronics Industry Development Association PCMCIA—Personal Computer Memory Card International Association In the illustrative embodiment the package 10 is constructed as a small outline package with J-bend leads 38. This permits the package 10 to be burned-in using standardized burn-in equipment for a conventional small outline J-bend (SOJ) package. By way of example, the standardized equipment can include an AMBYX$_{TM}$ intelligent burn-in and test system manufactured by Micron Systems Integration, Inc.

The external dimensions and outline of the assembled package 10, as well as the dimensions and configuration of the leads 38, can be according to JEDEC standards. For example, for an SOJ configuration, the package 10 can be formed with a width of from about 0.301 to 0.313 inches, a thickness of from about 0.105 to 0.109 inches and a length of from about 0.675 to 0.691 inches. The J-bend leads 38 can be formed with a minimum width of about 0.018 inches, on a pitch of about 0.048 to 0.052 inches and with a spacing between the center lines of the leads 38 on the opposite sides of the package 10 of about 0.260 to 0.275 inches.

As is apparent, the package 10 can also be constructed with a standard outline and lead configuration equivalent to other conventional plastic or ceramic semiconductor packages. These package configurations can include:

DIP (dual in line package)
ZIP (zig zag in line package)
LCC (leadless chip carrier)
SOP (small outline package)
QFP (quad flat pack)
TSOP (thin small outline package)
SOJ (small outline j-bend)
PGA (pin grid array)
LGA (land grid array)
BGA (ball grid array)

Figure 3:
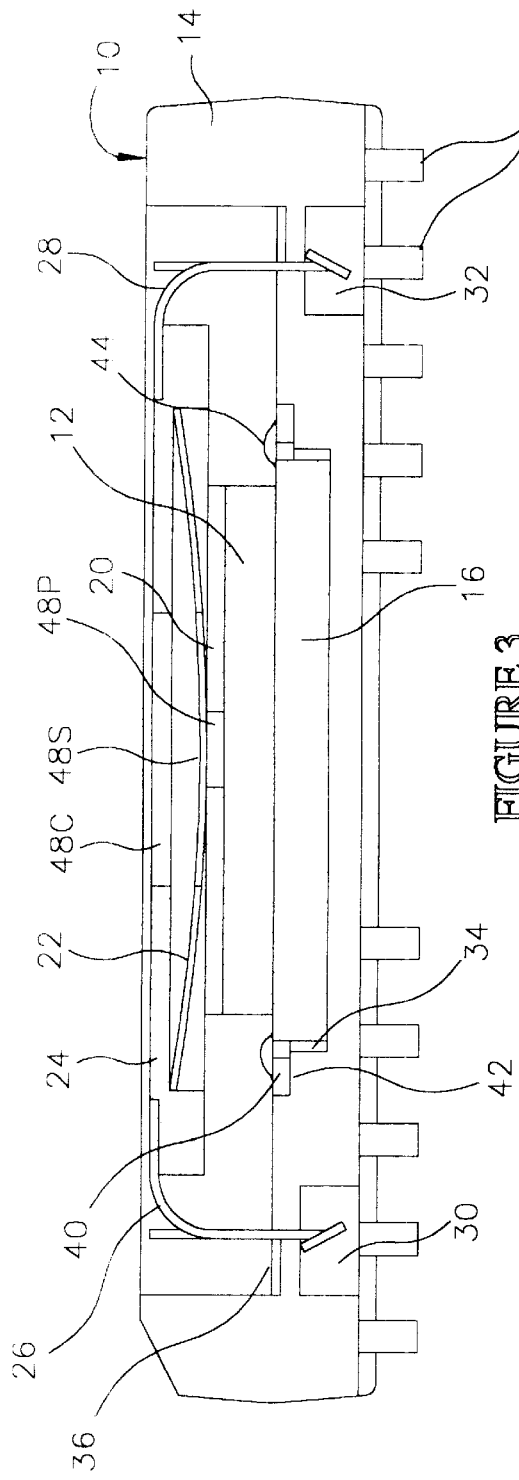
FIG. 3 is a cross sectional view taken along section line 3—3 of FIG. 2.

As shown in FIG. 3, in the assembled package 10, the die 12 is held within a recess 36 formed within the package base 14 and is sandwiched between the interconnect 16 and the cover 24. The interconnect 16 is mounted within a recess 34 formed within the package base 14. As also shown in FIG. 3, in the assembled package 10, the pressure plate 20 overlies the die 12, and the spring 22 presses the pressure plate 20 and the die 12 against the interconnect 16.

Still referring to FIG. 3, the clips 26, 28 attach to corresponding openings 30, 32 in the base 14 to secure the cover 24, spring 22 and pressure plate 20 of the force applying mechanism 18 and the die 12 within the package base 14. The clips 26, 28 can be formed of a flexible material such as spring steel, or plastic, and are shaped to exert a retention force on the cover 24. Furthermore, in the assembled package 10, the cover 24 is recessed below the top surface of the package base 14. The outer peripheral size and outline of the package 10 are thus substantially determined by the outer peripheral size and outline of the package base 14.

The cover 24, spring 22 and pressure plate 20 all include a central opening which are designated 48C, 48S and 48P respectively. As will be further explained, the openings 48C, 48S and 48P are used during assembly and disassembly of the package 10. Specifically, the openings 48C, 48S and 48P permit the die 12 to be held by a vacuum tool (not shown) during optical alignment of the die 12 and interconnect 16 during assembly. In a similar manner a vacuum tool (not shown) can be used to disassemble the package 10.

Figure 3A:
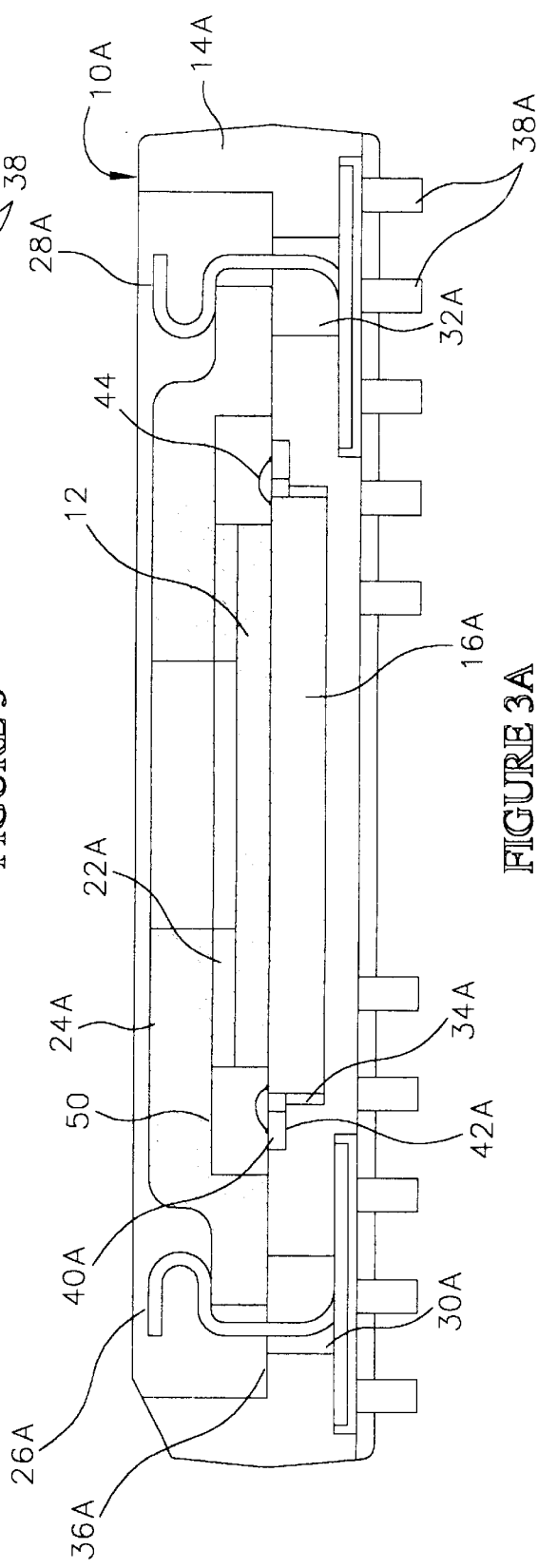
FIGS. 3A–3C are cross sectional views equivalent to FIG. 3 showing alternate embodiment packages.

FIG. 3A illustrate an alternate embodiment package 10A. The alternate embodiment package 10A includes substantially the same elements as previously explained for package 10 which are denoted with an "A" suffix. However, in the alternate embodiment package 10A the spring 22A is formed as a flat member and the pressure plate 20 (FIG. 3) is eliminated. By way of example, the spring 22A can be a flat metal spring (e.g., wave spring) or can be formed of a resilient elastomeric material such as a silicone elastomer or polyimide material.

In addition, in the alternate embodiment package 10A, the cover 24A includes a recess 50 which encloses the spring 22A and die 12. The cover 24A abuts a bottom surface of the recess 36A in the package base 14A and is retained by a pair of sliding clips 26A, 28A. The sliding clips 26A, 28A are slidably mounted to the base 14A and are formed in an S-shape to exert a retention force on the cover 24A.

Figure 3B:
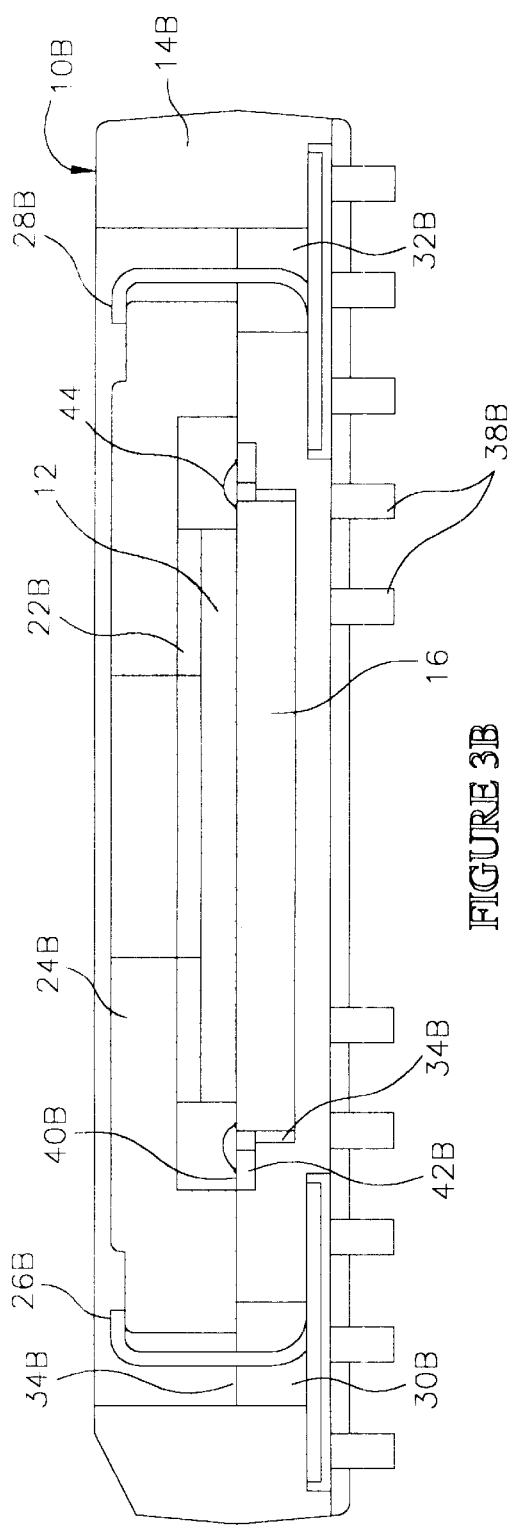

FIG. 3B illustrates an alternate embodiment package 10B that is substantially equivalent to package 10A. However, in package 10B the clips 26B, 28B are formed as sliding member similar to clips 26A, 28A but in a U-shape.

Figure 3C:
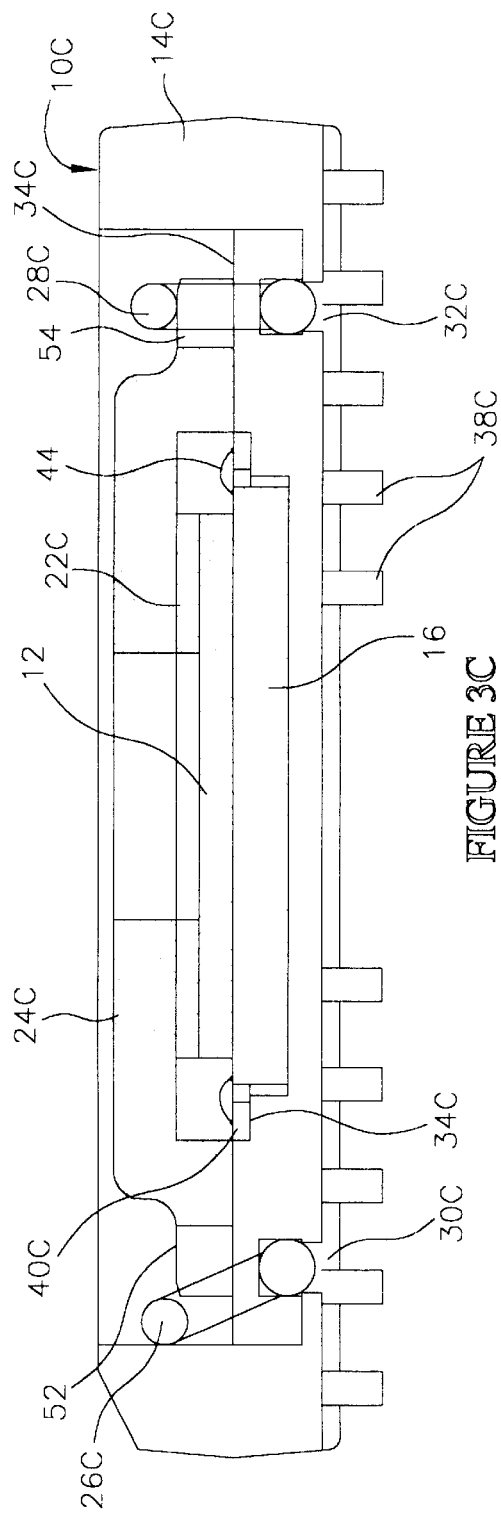

In FIG. 3C, an alternate embodiment package 10C includes clips 26C, 28C that are adapted to pivot and latch over the cover 24C. The clips 26C, 28C have a generally T-bone shape cross sectional configuration and are pivotably mounted to channel like openings 30C and 32C in the base 10C. As such, the clips 26C, 28C can be pivoted to latch over the cover 24C. The cover 24C includes cut out portions 52, 54 for the clips 26C, 28C.

Figure 4:
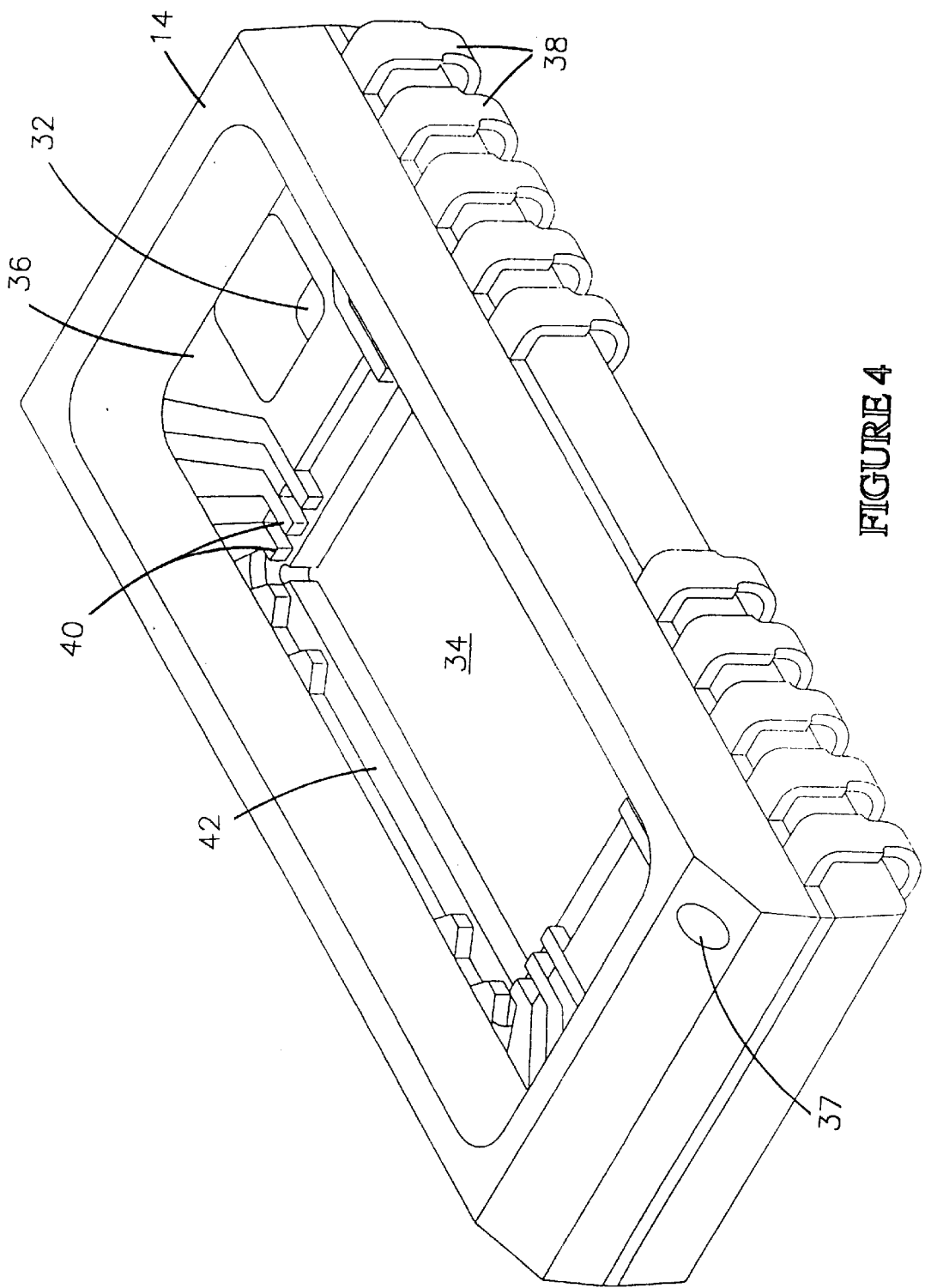
FIG. 4 is a perspective view of the package base.

Referring to FIG. 4, the package base 14 is shown separately. The package base 14 is formed of an electrically insulating material such as plastic or ceramic and includes internal conductors 40 in electrical communication with the J-bend leads 38. As previously stated, the package base 14 includes the recess 34 for mounting the interconnect 16 and the recess 36 which houses the die 12 and force applying mechanism 18. Viewed from above, the recesses 34 and 36 are enclosed on four sides and an end, and are open at one end. Another stepped recess 42 forms a bond shelf for wire bonding the interconnect 16 to the conductors 40 formed within the package base 14. The package base 14 also includes an indicator pocket 37 that can be used to indicate the orientation of the leads 38 with respect to the die 12 (i.e., pin #1 indicator package 10).

In the illustrative embodiment, the package base 14 is formed of a ceramic material such as alumina ($Al_2O_3$) using a high temperature ceramic lamination process. Such a process is described in U.S. patent application Ser. No. 08/398,309 filed Mar. 1, 1995. U.S. Pat. No. 5,519,332 which is incorporated herein by reference. Briefly, this process involves forming metallized circuits and metal filled vias on green sheets of ceramic and then sintering the sheets to form a unitary structure. The J-bend leads 38 can be formed of an underlying material such as nickel-iron or a copper based alloy, which may have a lead/tin on nickel gold plating. Depending on the material, the leads 38 can be soldered, welded, brazed or attached to the conductors 40 using conductive adhesives.

The package base 14 can also be formed using a 3-D injection molding process out of a high temperature glass filled plastic. Such a process is described in U.S. Pat. No. 4,985,116 and in the above incorporated U.S. patent application Ser. No. 08/398,309. U.S. Pat. No. 5,519,332 Suitable plastics include polyetherimide (PEI), polyethersulfone (PES), polyarylsulfone (PAS), polyphenylene sulfide (PPS), liquid crystal polymer (LCP) and polyether-ether ketone (PPEK). An injection molding process with these or other suitable material can be used to form the package base 14 into the desired rectangular shape and with cavities as required. During a subsequent metallization process, various circuit patterns are formed on different surfaces of the package base 14 and can be interconnected as required by filling the openings with a conductive metal. The J-bend leads 38 can be electrically attached to the conductive traces 40 by soldering, welding, brazing or conductive adhesives.

The package base 14 can also be formed using a ceramic dip formation process (Cerdip). In general, with a Cerdip process a mixture of alumina lubricants and binders can be molded and sintered to form a monolithic package base 14. A metal lead frame can be bonded to the package base 14 using low temperature glasses to form the conductors 40 and J-bend leads 38. Another type of ceramic dip formation process uses a plastic rather than a ceramic body. Briefly, this Cerdip formation process pre-molds a plastic base which is then bonded to a leadframe. Conventional semiconductor packages formed using this process are sold by GTE Products Corporation, Warren, Pa. under the trademark QUAD-PACK™.

Figure 5:
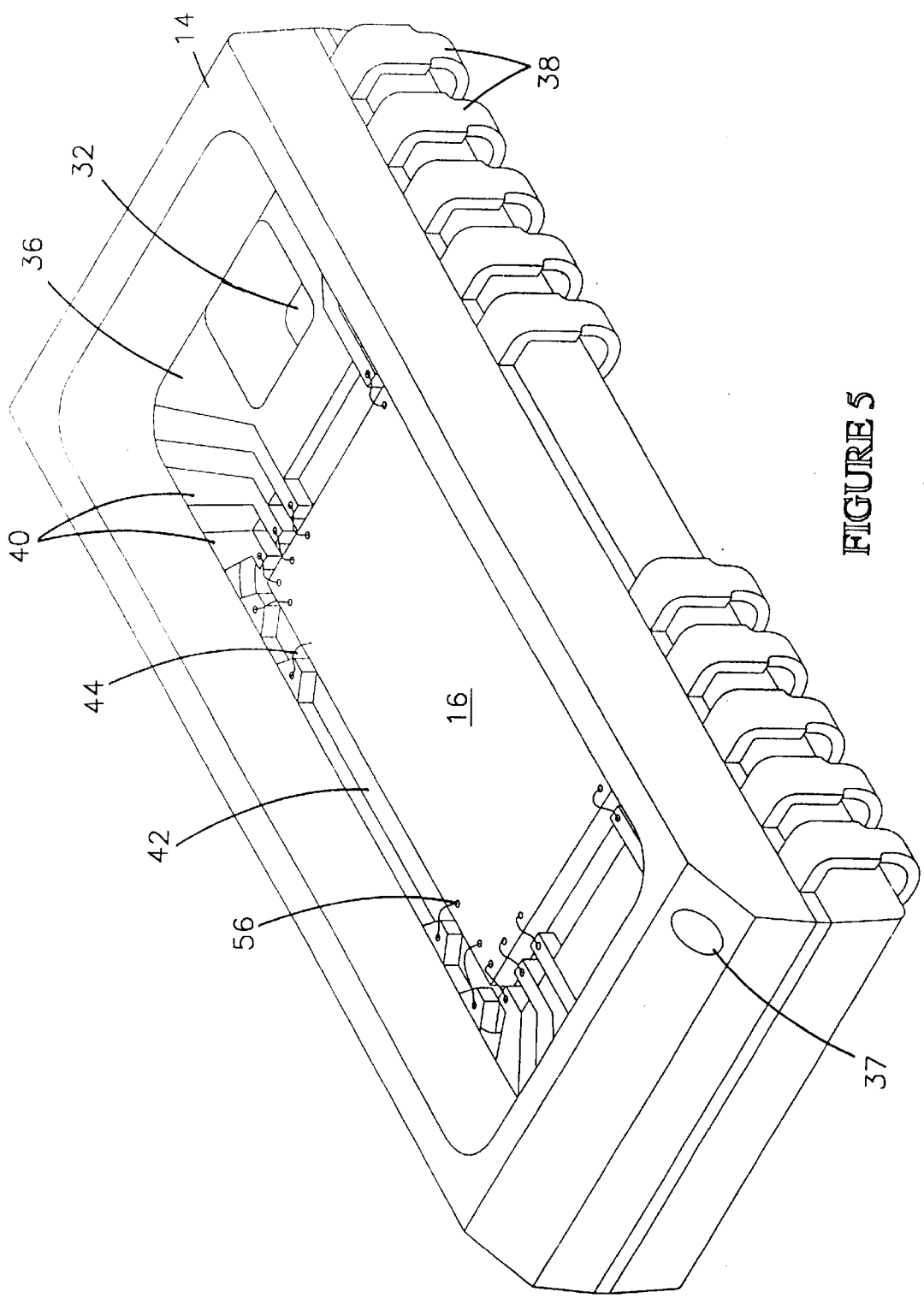
FIG. 5 is a perspective view of the interconnect wire bonded to the package base.
Figure 6:
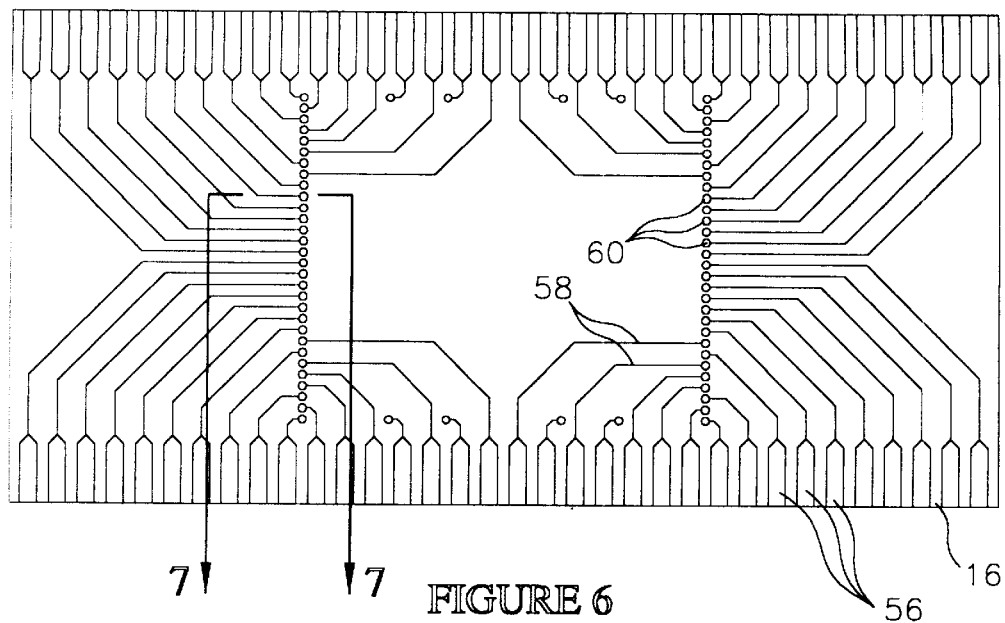
FIG. 6 is a plan view of the interconnect.
Figure 7:
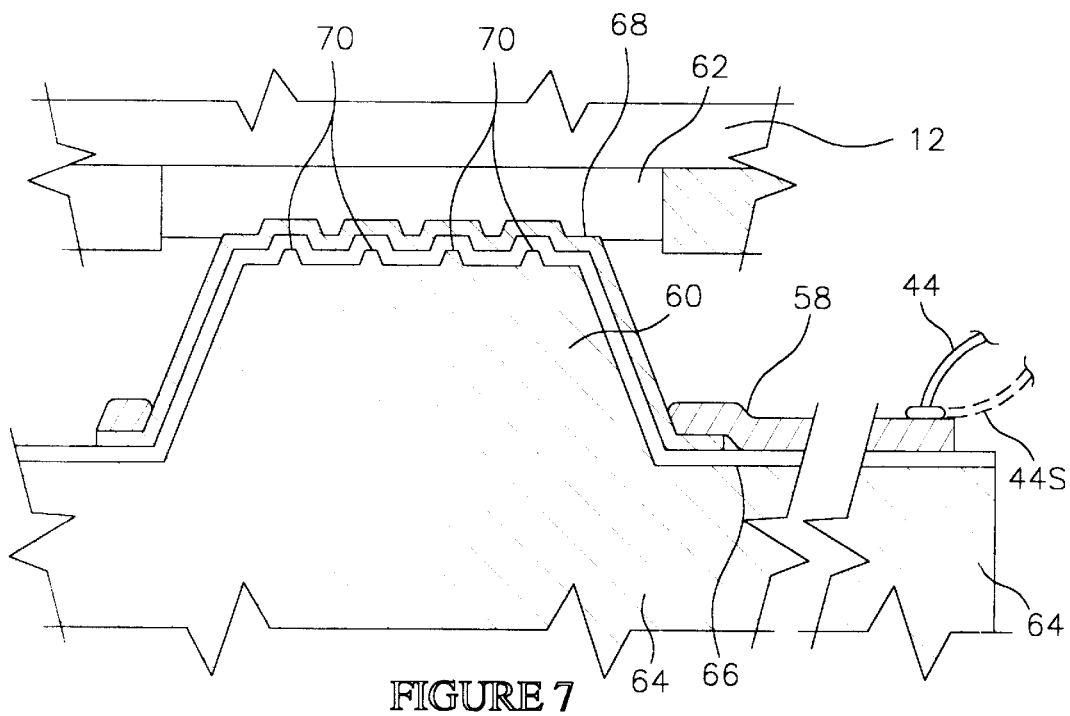
FIG. 7 is a cross sectional view taken along section line 7—7 of FIG. 6 showing a raised contact member on the interconnect electrically contacting a bond pad on the die.

Referring to FIG. 5, the interconnect 16 is shown electrically connected to the package base 14. Specifically, the interconnect 16 includes bonding pads 56 that are wire bonded to the conductors 40 formed in the package base 14. As shown in FIG. 6, the interconnect 16 also includes conductive traces 58 and raised contact members 60. As shown in FIG. 7, the raised contact members 60 are adapted to contact and establish an electrical connection with the device bond pads 62 on the die 12. In addition, the raised contact members 60 include penetrating projections 70 formed as elongated blades adapted to penetrate the device bond pads 62 to a self limiting penetration depth.

The interconnect 16 and raised contact members 60 can be formed by etching a silicon substrate 64. An insulating layer 66 and a conductive layer 68 formed on the substrate 64 overlie the raised contact members 60. The conductive layer 68 is in electrical communication with the conductive traces 58 which are wire bonded to bond wires 44. Alternately, in place of wire bonding, an electrical connection can be formed to the conductive traces 58 with slide contacts 44S.

A suitable process for forming the contact members 60 substantially as shown is disclosed in U.S. Pat. Nos. 5,326, 428 and 5,419,807 which are incorporated herein by reference. Another suitable process is disclosed in U.S. patent application Ser. No. 08/335,267 filed Nov. 7, 1994, U.S. Pat. No. 5,483,741 incorporated herein by reference.

Figure 7A:
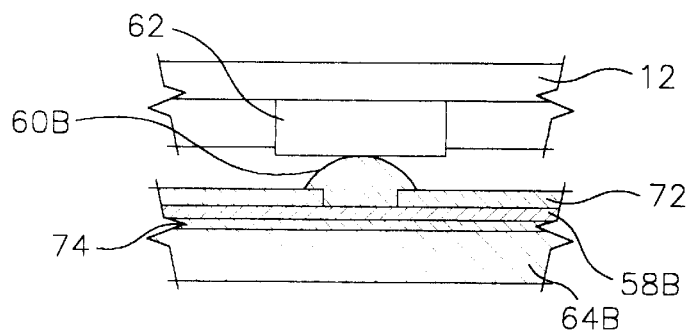
FIG. 7A is a cross sectional view equivalent to FIG. 7 of an alternate embodiment interconnect having a microbump contact member.

With reference FIG. 7A, the interconnect 16 can also be formed with microbump contact members 60B and conductive traces 58B formed on a plastic film 72. The microbump contact members 60B and plastic film 72 can be similar to two layer TAB tape such as ASMAT manufactured by Nitto Denko. The plastic film 72 can be mounted to a substrate 64B such as silicon using a compliant adhesive layer 74. The compliant adhesive layer can be formed of a silicone elastomer, an epoxy or a polyimide material. One method for forming an interconnect with microbump contact members is described in previously cited U.S. patent application Ser. No. 08/398,309.

Referring again to FIG. 1, the package 10 can be assembled using optical alignment techniques and aligner bonder tools used for flip chip bonding semiconductor dice. Flip chip bonding refers to a process wherein a semiconductor die is placed face down on a substrate, such as a printed circuit board, and the bond pads on the die are bonded to connection points on the substrate. Tools for flip chip bonding are sometimes referred to as aligner bonders. An aligner bonder and method of optical alignment for flip chip bonding are described in U.S. Pat. No. 4,899,921 to Bendat et al, entitled "Aligner Bonder". Such an aligner bonder is available from Research Devices of Piscataway, N.J.

In the present case, an aligner bonder may be modified to provide an assembly apparatus for use in assembling the package 10. The assembly apparatus includes an assembly tool (not shown) that is adapted to retain the force applying mechanism 18 (FIG. 1), die 12 and clips 26, 28 (FIG. 3). The components of the force applying mechanism 18 include openings 48C, 48S, 48P which allow a vacuum wand (not shown) of the assembly tool to hold the die 12. With the die 12 held by the assembly tool, the bond pads 62 (FIG. 7) on the die 12 are aligned with the contact members 60 (FIG. 7) on the interconnect 16. The assembly tool then places the die 12 in contact with the interconnect 16 and secures the clips 26, 28 (FIG. 3) to the openings 30, 32 in the package base 14.

U.S. patent application Ser. No. 08/338,345 filed Nov. 14, 1994, U.S. Pat. No. 5,634,267, incorporated herein by reference, describes an automated apparatus suitable for optically aligning the die 12 and interconnect 16 and securing the force applying mechanism 18 to the package base 14.

Following the assembly procedure the package 10 can be used to test the die 16. Testing can include full functionality as well as burn-in testing. Following the test procedure, the package 10 can be disassembled using an assembly tool (not shown) to remove the clips 26, 28 and force distribution mechanism 18 substantially as previously described for the assembly procedure.

Figure 8:
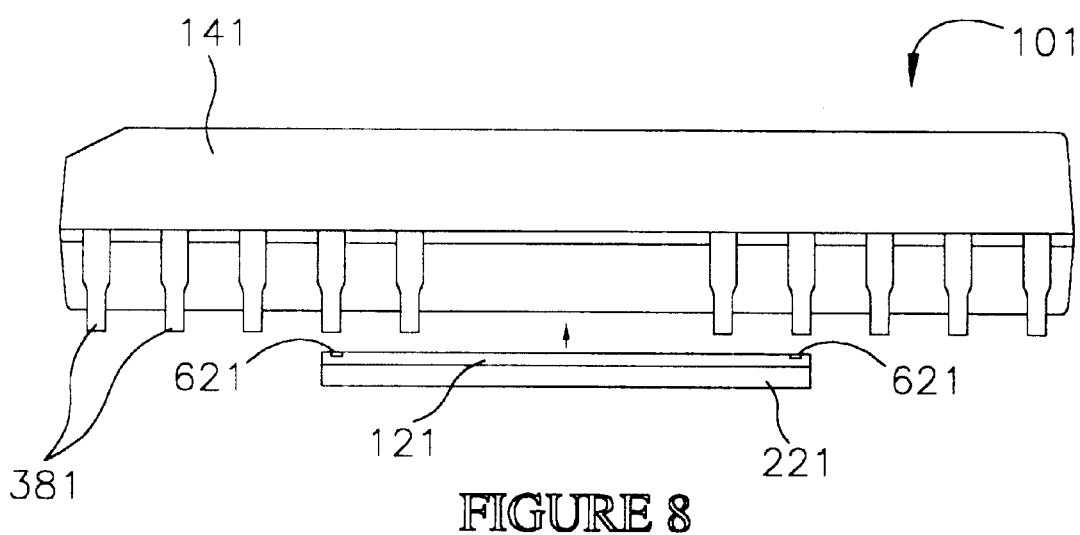
FIG. 8 is a schematic cross sectional view of an alternate embodiment package adapted to hold the die circuit side up.

Referring now to FIG. 8, an alternate embodiment package 10I is shown. The alternate embodiment package 10I is substantially similar in construction to the package 10 previously described except that package base 14I is formed for mounting the die circuit side up with respect to the leads 38I. An interconnect (not shown) for the package 10I thus includes raised contact members that face downwardly in FIG. 8. The bond pads 62I on the die 12 are thus in the same position as the bond pads for a die in a conventional package. The leads 38I on the package 10I can thus exactly correspond to the input/output configuration as the leads for a conventional package. With this lead configuration a burn-in board or other testing equipment does not require modification to accommodate the lead configuration. The package 10I includes an elastomeric spring member 22I that maintains the die 12 in contact with the interconnect 16I substantially as previously described.

While the invention has been described with reference to certain preferred embodiments, as will be apparent to those skilled in the art, certain changes and modifications can be made without departing from the scope of the invention as defined by the following claims.

What is claimed is:

1. A package for testing a semiconductor die having a plurality of contact locations comprising:

a base comprising a recess and a plurality of external leads, the base and the leads in a configuration substantially equivalent to a conventional semiconductor package;

an interconnect on the base comprising a plurality of contact members configured to make electrical connections with the contact locations on the die; and a force applying mechanism on the base including a clip attaching the mechanism to the base, the mechanism configured to bias the die and the interconnect together, the mechanism and the clip contained within the recess such that a size and an outline of the package are substantially equivalent to the conventional semiconductor package.

2. The package of claim 1 wherein the mechanism comprises a spring and a cover.

3. The package of claim 1 wherein the mechanism comprises a spring and a cover comprising a second recess configured to at least partially contain the spring.

4. A package for testing a semiconductor die having a plurality of contact locations comprising:

a base comprising a recess and a plurality of external leads, the base and the leads in a configuration substantially equivalent to a conventional semiconductor package conforming to standards of an industry standard setting body;

an interconnect on the base comprising a plurality of contact members configured to make electrical connections with the contact locations on the die;

a force applying mechanism on the base including a clip attaching the mechanism to the base, the mechanism configured to bias the die and the interconnect together, the mechanism and the clip contained within the recess such that a size and an outline of the package are substantially equivalent to the conventional semiconductor package.

5. The package of claim 4 the mechanism comprises a spring and a cover having a second recess for the spring.

6. The package of claim 4 wherein the industry standard setting body comprises a Joint Electron Device Engineering Council (JEDEC).

7. A package for testing a semiconductor die having a plurality of contact locations comprising:

an interconnect comprising a substrate and a plurality of contact members configured to make electrical connections with the contact locations on the die;

a base comprising a recess and a plurality of external leads, the base and the leads in a configuration substantially equivalent to a conventional semiconductor package conforming to standards of an industry standard setting body;

a plurality of wires bonded to the interconnect and to the base;

a spring and a cover on the base and a clip attaching the spring and the cover to the base, the spring and the cover configured to bias the die and the interconnect together, the cover, the clip and the spring contained within the recess such that a size and an outline of the package are substantially equivalent to the conventional semiconductor package, the cover including a second recess configured to at least partially enclose the spring and the wires.

8. The package of claim 7 wherein the industry standard setting body comprises a Joint Electron Device Engineering Council (JEDEC).

9. The package of claim 7 wherein the contact members comprise projections at least partially covered with conductive layers.

10. The package of claim 7 wherein the interconnect comprises microbumps on a polymer film attached to the substrate.

11. The package of claim 7 wherein the conventional semiconductor package is selected from the group consisting of DIP (dual in line package), ZIP (zig zag in line package), LCC (leadless chip carrier), SOP (small outline package); QFP (quad flat pack), TSOP (thin small outline package), SOJ (small outline j-bend), PGA (pin grid array); SOJ (small outline j-bend), PGA (pin grid array), BGA (ball grid array) and LGA (land grid array).

* * * * *